United States Patent [19]

Lace et al.

[11] Patent Number: 4,772,371
[45] Date of Patent: Sep. 20, 1988

[54] ELECTROPLATING APPARATUS

[75] Inventors: Melvin A. Lace, Prospect Heights, Ill.; Mark Stanford, Port Monmouth, N.J.; Raj B. Patel, Piscataway, N.J.; Gannady Volkov, Mountainside, N.J.

[73] Assignee: Vanguard Research Associates, Inc., South Plainfield, N.J.

[21] Appl. No.: 24,824

[22] Filed: Mar. 12, 1987

[51] Int. Cl.⁴ ............................................. C25D 17/00
[52] U.S. Cl. .................................................. 204/211
[58] Field of Search ................................. 204/206, 211

[56] References Cited

FOREIGN PATENT DOCUMENTS 44-1807  1/1969  Japan ................................... 204/211
1416512 12/1975  United Kingdom ................. 204/211

Primary Examiner—T. M. Tufariello
Attorney, Agent, or Firm—Stefan J. Klauber

[57] ABSTRACT

An electroplating apparatus for high-speed electroplating a cathodic strip of metal passed therethrough. The apparatus includes an elongated cell subdivided into a plurality of sub-cells defined by bottom and side walls and slotted partition walls for passage of the strip from one sub-cell to the next. Each sub-cell is provided with a pair of anodes, and means are provided for circulating electrolyte continuously in and through each sub-cell. The elongated cell is mounted within a surrounding sump tank which functions to collect and remove the overflowing electrolyte. The anode pairs present in each sub-cell are preferably activated in time sequence, proceeding from one end to the other of the cell.

14 Claims, 6 Drawing Sheets

FIG. 5
FIG. 6
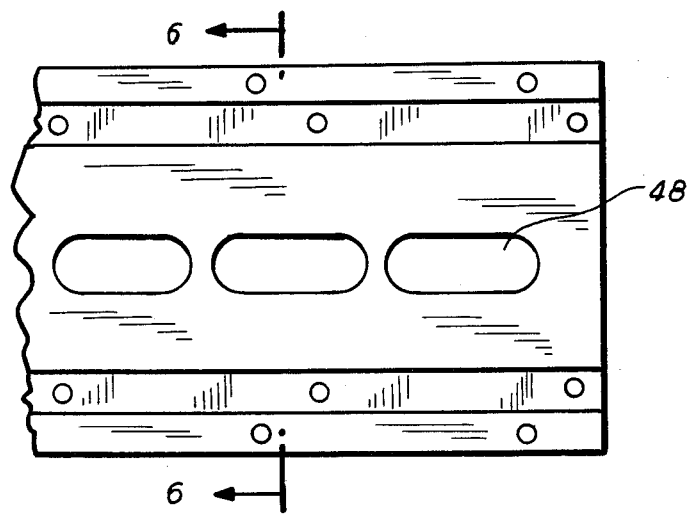
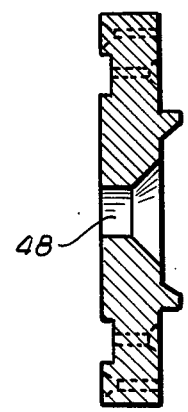
FIG. 7
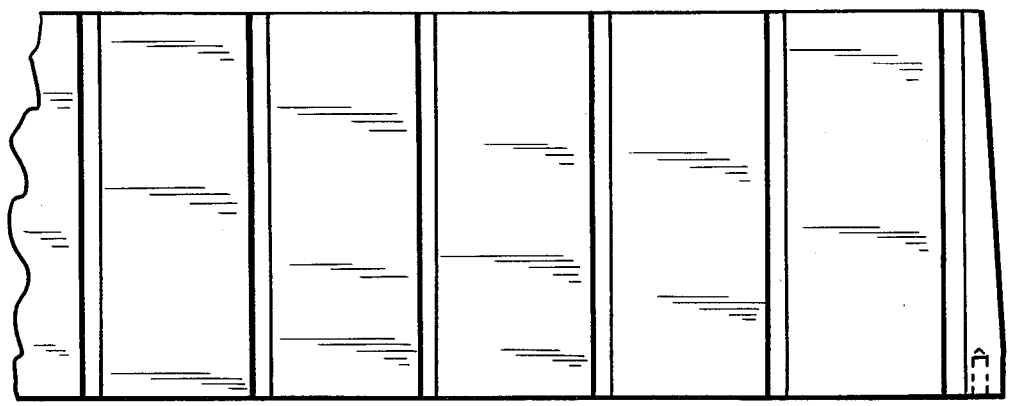

ELECTROPLATING APPARATUS

BACKGROUND OF THE INVENTION

This invention relates generally to electroplating apparatus, and more specifically, relates to apparatus useful in the electroplating of metals onto lengths of metallic base stock.

In numerous applications pertaining to the fabrication of electronic components, connectors, circuit boards and the like, a requirement exists for electroplating or otherwise depositing a precious metal, such as gold or palladium, or an alloy such as palladium-nickel onto a surface of a non-precious metal such as nickel or the like, for the purpose of improving the electrical and wear characteristics of the base metal, at least at the portion thereof where electrical connections are to be effected. Thus a metal such as gold is useful for such purposes because of its excellent and uniform electrical interface properties, its relative unalterability, and its high solderability.

At one time, it was relatively common to provide precious metal gold electroplating over an entire surface of a base conductor or face of an electronic component, even though only a very limited portion of the surface being plated was actually intended to receive the electrical connections. Because, however, of various factors, including enormous increases in the cost of gold, and of other precious metals, efforts have been made in recent years to devise apparatus and methods for electroplating the precious metal only onto those portions of the base material at which the ultimate electrical connections are to be made. The savings which can result from the use of these selective electroplating techniques are relatively enormous.

In one particular method for fabricating electronic connectors, a continuous strip of a base material having a desired surface, such as of nickel, is subjected to a series of punching and forming operations, such that terminal connectors for electrical components are eventually formed toward what were originally the lateral edges of the strip. For present purposes the important point to note is that as one aspect of fabrication methods of this type, the continuous metal strip, prior to the punching and forming operations, preferably has deposited thereupon longitudinally extending stripes of a precious metal such as gold. These precious metals, e.g. gold stripes, can, for example, extend along the lateral portions of the metal strip, or one or more such stripes can extend longitudinally at positions displaced from the lateral edges. Ultimately, these stripes (or lines) will define the electrical connection areas in the devices which are fabricated from the metal base strip.

As mentioned, the surface which is selectively electroplated with the precious metal is preferably nickel, but therein lies the problem. A strip formed solely from nickel is expensive to produce and, furthermore does not have the desired physical characteristics to be handled by the apparatus used for precious metal electroplating. It, therefore, is common practice to electroplate a base metal, such as copper, or a copper alloy, with the nickel to provide the desired surface. The resultant nickel surface, however, must be uniform and of a thickness suitable for the ultimate use of the strip after the precious metal has been applied.

Also to be noted, is that while the discussion thus far has been especially directed at an ultimate product wherein a precious metal is deposited upon the nickel, there are also instances wherein the base metal strip plated with nickel alone, may comprise, per se, a suitable product for a desired application. In this event as well, the nickel plating must have the required uniformity, high wear resistance, and the like.

Experience has shown that serious problems are encountered in securing the availability of the necessary nickel-plated strip with the nickel of the desired thickness and uniformity.

In a typical production line, the base strip upon which the precious metal is to be applied, may indeed be initially plated with nickel as aforementioned, and thus the nickel-plated strip may be regarded as an "intermediate" in the overall operation proceeding from base strip to finished precious metal-plated product. Here, however, it has been found that a bottle-neck is created in the production line because of the time and/or the size of the apparatus heretofore required to produce the intermediate material. With conventional plating apparatus, increasing the current density in an effort to effect an increase in the plating rate, generally results in a degradation of the quality of the plated deposit. There is, therefore, an important need for apparatus which will make this operation faster without requiring more or larger equipment or which will permit the use of smaller equipment for equal electroplating capacity.

It is, accordingly, an object of the present invention, to provide electroplating apparatus which permits a reduction in the time required to electroplate a unit of surface.

It is another object of the invention, to provide apparatus of the character indicated, which permits the strip to be electroplated to be fed at increased rates.

It is a further object of the invention to provide apparatus of the character indicated which permits smaller equipment to provide equivalent electroplating capacity.

These and other objects and advantages of the invention will be readily apparent from the following description of illustrative embodiments, taken in connection with the accompanying drawings.

SUMMARY OF THE INVENTION

In accordance with the invention, there is provided an electroplating cell which is subdivided into a plurality of compartments or sub-cells, each of which is separately provided with at least a pair of anodes and which is constructed to receive and treat the strip to be plated. Such strip is rendered cathodic, by a suitable potential source and is continuously passed through the compartments or sub-cells when the cell is in operation. The compartments are constructed to receive fresh electrolyte continuously, and continuously to discharge partially-spent electrolyte during cell operation. The anode pairs are preferably arranged and actuated, to make possible simultaneous or seriatim energization during movement of the strip through the cell. Increased current densities are made possible without adverse effect upon the plated deposit, and high efficiencies can be achieved.

BRIEF DESCRIPTION OF THE DRAWINGS

The invention is diagramatically illustrated, by way of example, in the drawings appended hereto, in which:

FIG. 5 is a partial plan view of the top piece of the sparger box which forms the bottom of the subdivided cell;

FIG. 6 is a transverse cross-sectional view through the top piece of FIG. 5, taken along the line 5—5 therein;

FIG. 7 is a partial plan view of one of the side walls which serve to define the sub-cells;

DESCRIPTION OF PREFERRED EMBODIMENT

Figure 1:
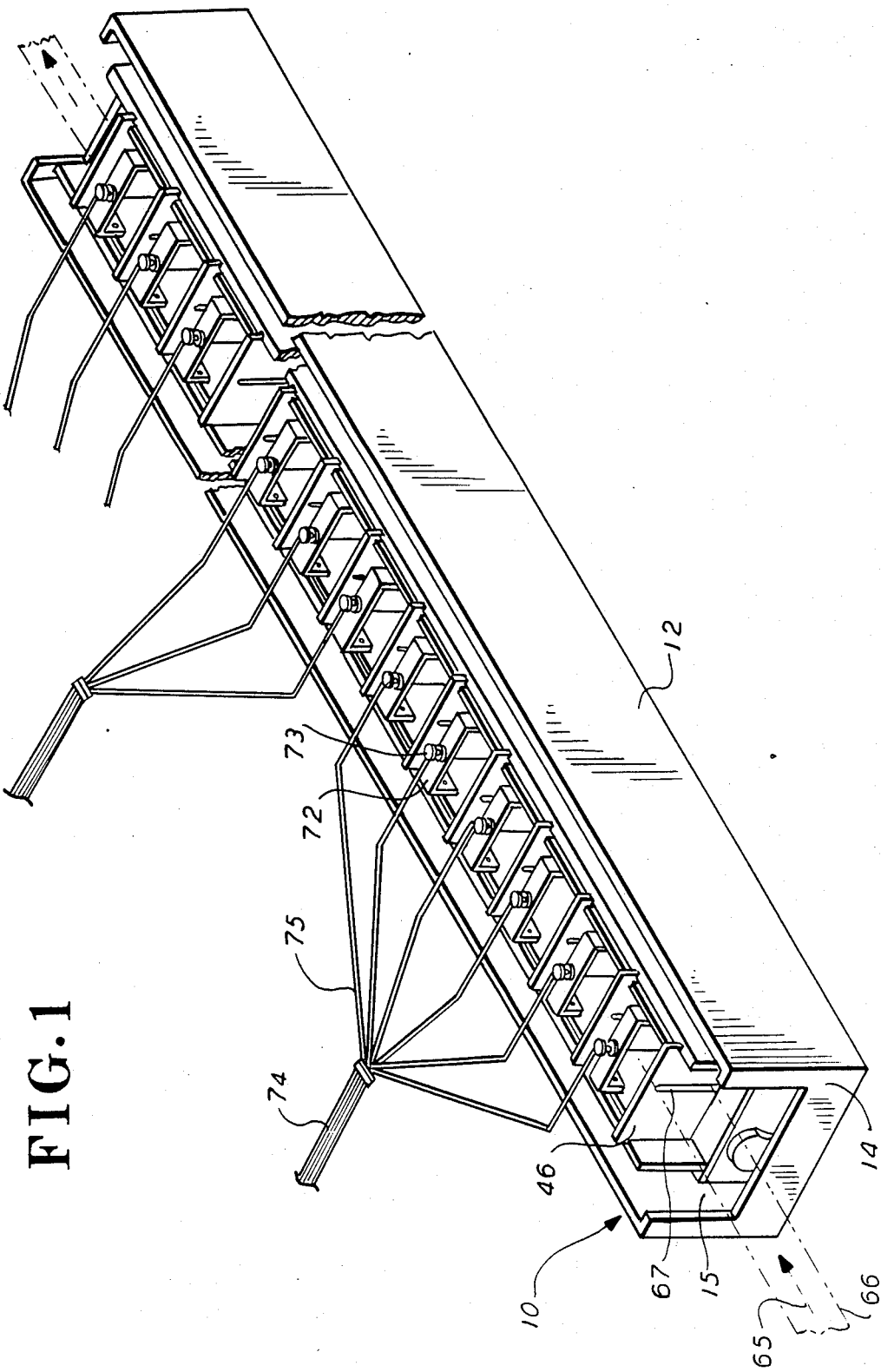
FIG. 1 is a perspective view of an electroplating apparatus embodying features of the present invention.

Referring to the drawings, the reference numeral 10 designates a sump tank into which the partially-spent electrolyte is discharged and from which it is removed for fortification and recycling to the cell. The tank 10 has side walls 12 and end walls 14 and is fluid tight. It is preferably formed of an electrically insulating chemically resistant material, e.g. of a plastic such as a molded polypropylene. The bottom 16 of tank 10 in the embodiment shown, has openings 18 near each of its ends into each of which a drain pipe 20 is sealed, which, by means of a union 22 is connected to a drain line 24 which leads away from the tank 10 to any desired point.

Figure 8:
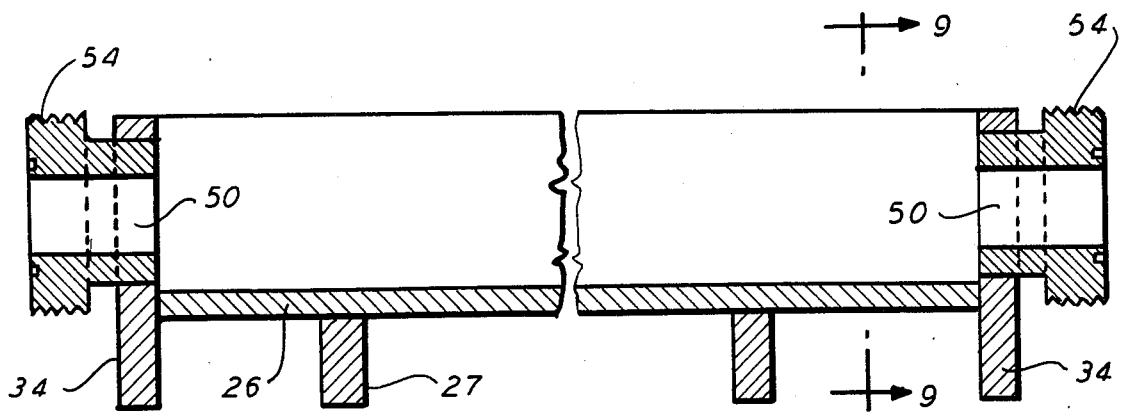
FIG. 8 is a longitudinal sectional view through the sparger box.
Figure 11:
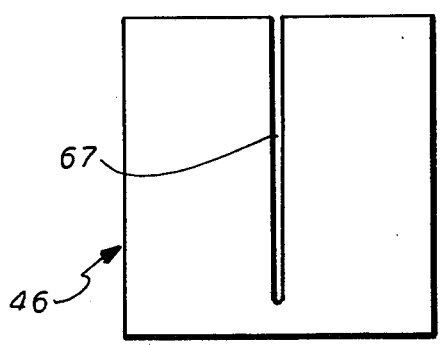
FIG. 11 is a plan view of a partition plate for subdividing the cell.

Interiorly of tank 10, and supported upon bottom 16, is disposed a cell structure defined by a distributor unit or "sparger" 25 comprising a bottom 26, side walls 32, and end walls 34. The bottom 26 suitably does not rest directly upon tank bottom 16 but is spaced from it vertically by legs or spacers 27 (FIG. 8) so that electrolyte to be discharged can pass under bottom 26.

Figure 9:
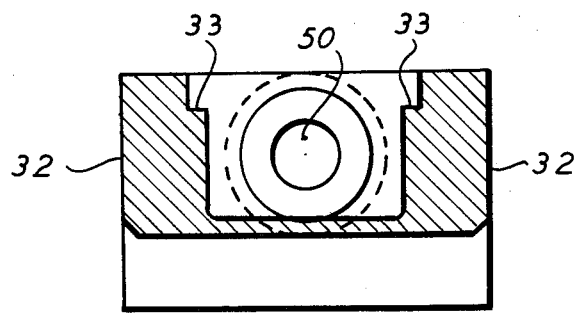
FIG. 9 is a transverse sectional view of the sparger box, taken along the line 9—9 of FIG. 8.
Figure 10:
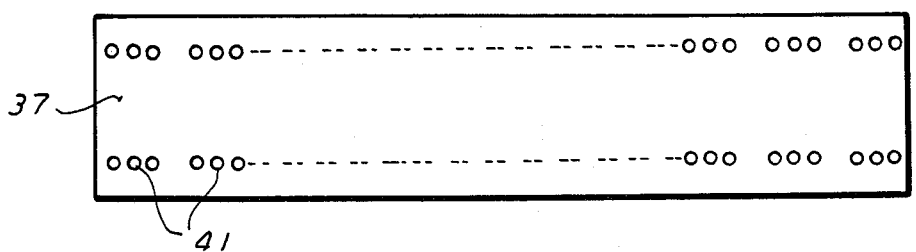
FIG. 10 is a plan view of the sparger card portion of the sparger box.

Sparger 25 is closed by a top piece 36. An intervening distributor card 37 (FIG. 10) rests along shoulders 33 (FIG. 9) formed at the inward faces of walls 32, so that electrolyte introduced into the interior of the sparger may exit same through openings 39 after the flow is first streamlined and rendered non-turbulent by passage through the series of perforations 41 in card 37.

Resting upon the top piece 36 of sparger 25 is an electroplating cell unit, and suitably formed, as by molding, from an insulating material, such as a plastic, such as polypropylene. The bottom of the electroplating cell unit is effectively comprised by piece 36. Side walls 33 and 40 are secured to piece 36, as by screws (see FIGS. 5 and 6). The side walls 38 and 40 of the electroplating cell unit are formed with series of opposed recesses 42 and 44, respectively, for the sliding reception of cell partition plates or gates 46 which extend transversely of the cell unit for subdividing the cell into a plurality of compartments or sub-cells. In a typical cell there are twenty-five partitions or gates 46 subdividing the electroplating cell unit into twenty-four compartments or sub-cells. Thus a unitary cell unit 48" long is typically divided into twenty-four compartments, each approximately 2" long. It will be seen that the gates 46 have a greater height than side walls 38 and 40.

Figure 3:
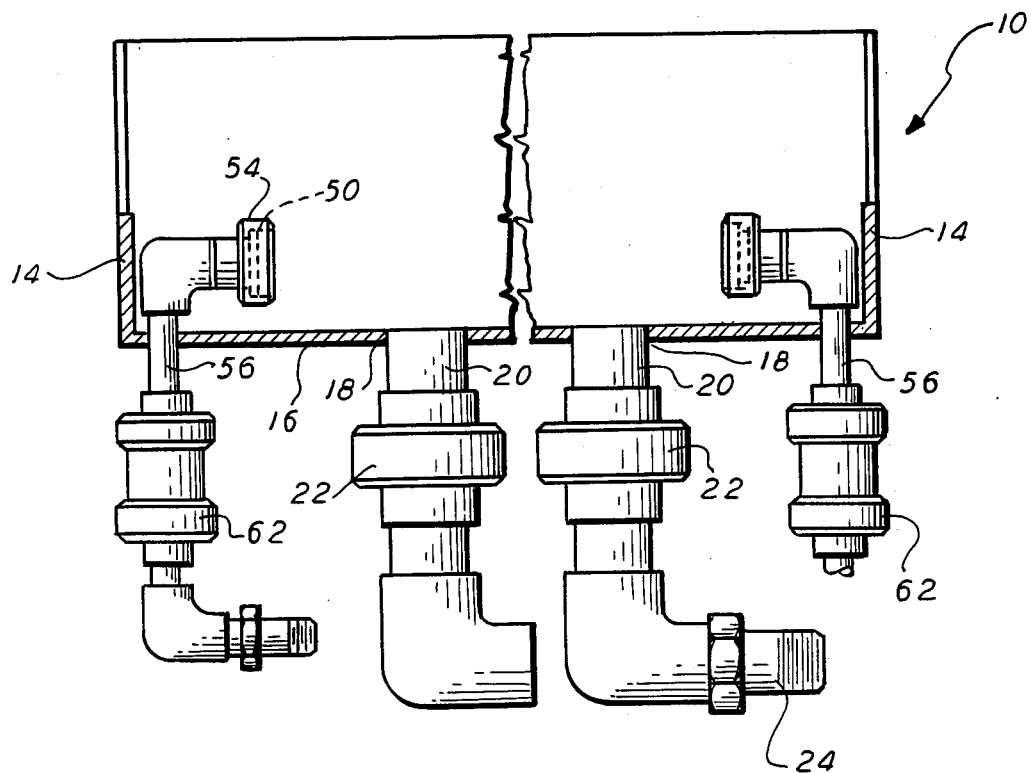
FIG. 3 is a longitudinal sectional view of the outer container of the FIGS. 1 and 2 apparatus, and depicts the pipe connections for overall introduction and removal of electrolyte.
Figure 4:
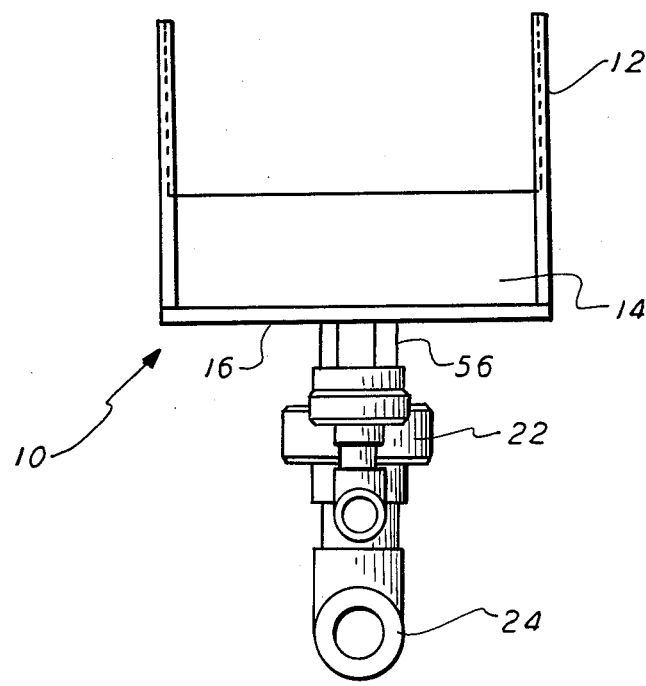
FIG. 4 is a front elevational view of the outer container of FIG. 3.

The piece 36, which simultaneously serves as a top for the distributor unit to whose side walls 32 it is secured (FIGS. 5 and 6) is formed with a plurality of elongated slots 48, with each slot 48 being positioned between a pair of partitions 46, so that there is one slot for each sub-cell defined by the partitions. The slots 48 permit flow of electrolyte from the interior of the distributor unit into each sub-cell. For receiving fresh electrolyte from any convenient source, the end walls 34 of the distributor unit are provided with inlets 50 which, as shown in FIG. 3, are connected via unions 54 to electrolyte inlet lines 56, leading to the electrolyte source, and provided with valves 62. As seen in FIG. 3, the inlet lines are conveniently passed through otherwise sealed openings in sump tank bottom 16.

As seen in FIG. 1, end walls 14 of sump tank 10 are formed with open or cut-out portions 15 of less height than side walls 12, to permit passage of the base strip (shown in dotted lines at 66) which is to be electroplated, into and out of the cell unit—e.g. by movement in direction 65. For the same purpose, partitions or gates 46 are formed with aligned narrow slots 67, as can be seen in FIG. 1.

One of the features of the electroplating apparatus of the invention is that each sub-cell is provided with its own individual anodes, with the anodes in each sub-cell being electrically insulated from the anodes in other sub-cells. The strip 66 being electroplated is cathodic, and is made so by bringing it into contact with the negative terminal of a suitable power supply, as by a brush or other sliding contact (not shown), at some point exteriorly of the cell, in conventional manner.

Figure 2:
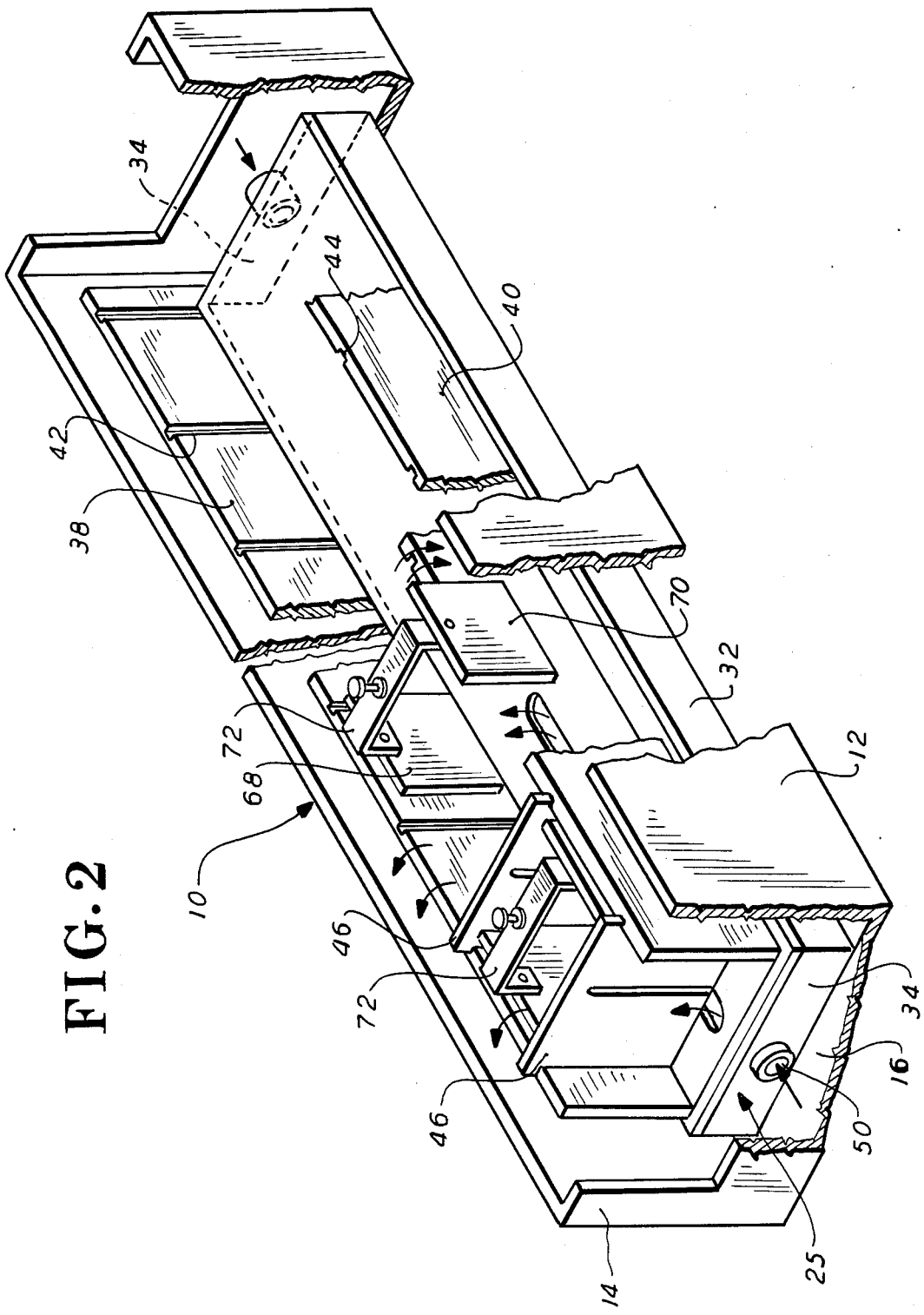
FIG. 2 is another perspective view of the apparatus shown in FIG. 1, but is partially cut away to show details of construction.

Returning to the anodes, and referring particularly to FIGS. 1 and 2, within each sub-cell defined in the space between walls 46 are positioned anodes 68 and 70, lying against side walls 38 and 40; i.e. so that a pair of anodes lies within the sub-cell defined between each said pair of partition walls or gates 46. The anodes are suitably formed from copper or other metallic conductor. Each pair of anodes is electrically connected by means of a U-shaped contact or bus bar 72 connected to them and formed, for example, of niobium, or the like. In turn, each bus bar 72 is connected electrically via connectors 73 for appropriate energization by means of an electrically-conductive conduit 75. As seen in FIG. 1, each contact or bus bar 72 is supplied by a single conduit 74 for individual energization, if desired.

When the cell described above is operated, the strip 66 to be electroplated is passed in continuous fashion through the slots 67 of the partitions or gates 46. The strip 66 is supplied from any convenient source, e.g. a reel (not shown), and after passing through the slots 67 and leaving the cell, is accumulated in any convenient manner, e.g. on a take-up reel (not shown), the strip 66 having been made cathodic in any manner, e.g. by means of an energized brush, as mentioned. Suitably the strip 66 is passed through the cell continuously from the source to the accumulating means, but it may be passed intermittently, if desired. Fresh electrolyte, is pumped through inlets 50 at opposite ends of the cell and, because of the slots 48 in cell unit bottom 36, the electrolyte rises in each sub-cell and, by reason of the fact that the gates 46 are higher than side walls 38 and 40, the electrolyte overflows side walls 38 and 40, and falls by gravity into tank 10. As in the case of the movement of the strip 66 being electroplated, the electrolyte may be pumped continuously or intermittently. When pumped intermittently, the pumping is preferably in phase with the movement of the strip 66. The movement of the electrolyte into the sub-cells through the slots 48, which are elongated in form and preferably represent at least about twenty-five percent of the area of the bottom 36 confined in each sub-cell, causes turbulent movement of the electrolyte in each sub-cell and ensures thorough agitation.

The electrolyte which overflows side walls 38 and 40 and falls into tank 10 is suitably removed from the tank in any convenient manner. In the embodiment illustrated, tank 10 is as mentioned, provided with two drain pipes 20 which are connected to drain lines 24. The electrolyte which has fallen into tank 10 is, of course, reduced in nickel ion as the result of the electroplating action and the thus-expelled electrolyte needs to be replenished. This is effected at any convenient point (not shown), and the electrolyte is brought up to its initial concentration and recycled as fresh electrolyte through inlet lines 56 and inlets 50. Other means for removing the spent electrolyte from tank 10 may be employed. For example, the tank 10 may be provided with a sump pump (not shown). Furthermore, pumps (not shown) may be provided in drain lines 24, if desired.

Application of current to anodes in the sub-cells may be carried out in any convenient manner. Most suitably, however, and preferably, it is applied in sequence, i.e. the plating potential is first applied to the first pair of anodes, then this pair is de-energized and the potential is applied to the second pair successively adjacent; then to the third pair; and so on. Thus only one anode pair is activated at a time, and the remaining twenty-three pairs are "resting".

Figure 12:
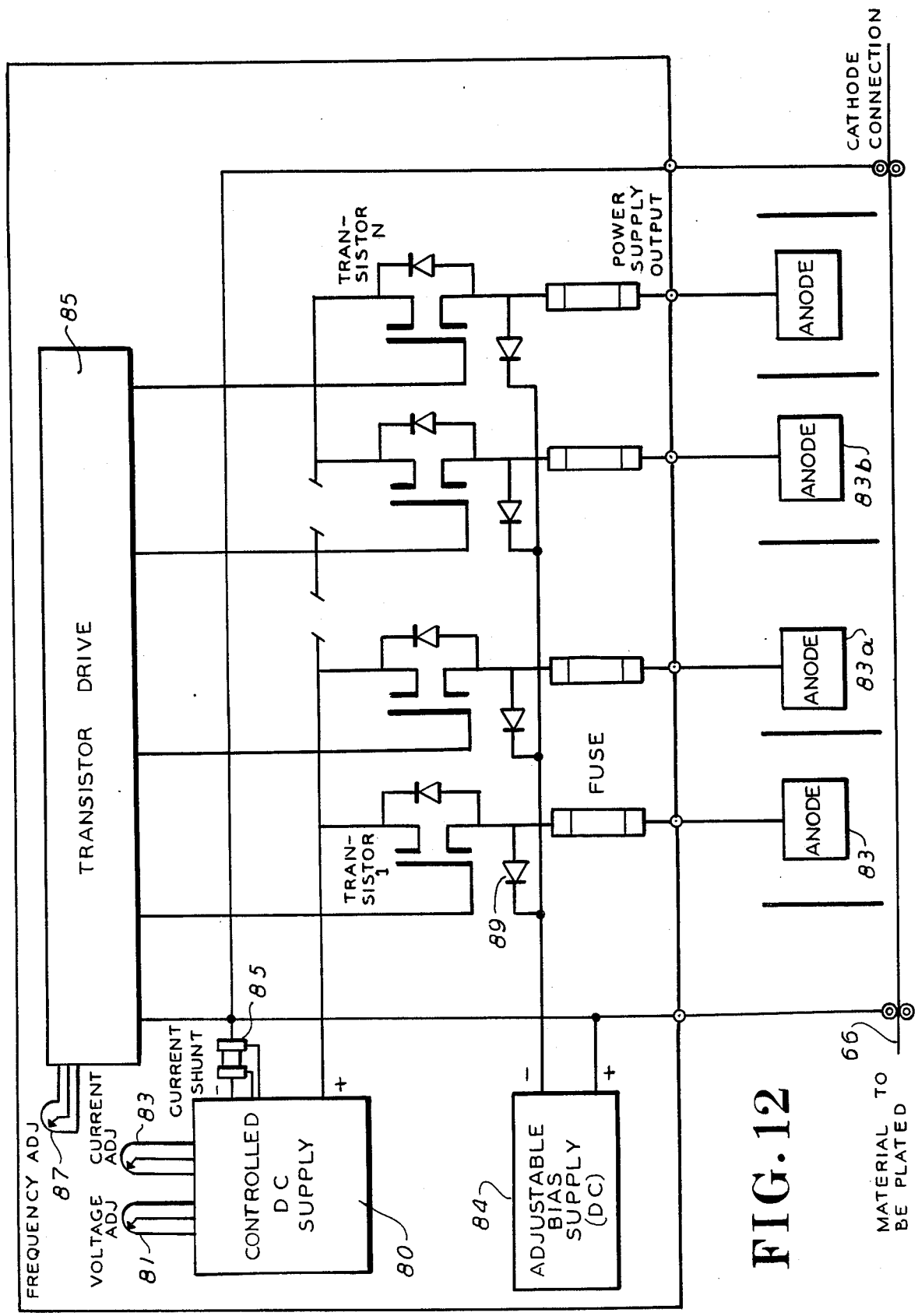
FIG. 12 is an electrical block diagram, which schematically depicts the manner in which suitable electrical potential may be provided to the present apparatus, in a preferred mode of operating same.

FIG. 12 schematically illustrates a typical and referred electrical system for the apparatus of the invention, a system which can provide the sequential energization just described. The power supply comprises a controlled DC supply 80 which provides the plating potential. Supply 80 includes means 81 and 83 for adjusting potential and current levels, and a current shunt 85 for more accurately controlling current level. A transistor switching network is provided, which includes a plurality of MOS power transistors 82—one each for each anode 83—corresponding to an anode pair 68, 70 in FIG. 2. Potential is sequentially switched to the anodes 83, 83a, 83b etc., by transistor drive logic 85, which sequences activation of transistors 82, so as to switch the plating potential and current to each anode pair in sequence. A small DC supply 84 serves to back bias the switching transistors by holding the cathode positive in those sections (sub-cells) in which the anodes are turned off. Blocking diodes 89 assist this function. The negative output of the DC power supply is connected to the cathode connection of the plating tank (thereby to provide cathodic potential to strip 66); and its positive output is connected via the switching transistors to the individual anodes. The transistors are switched on in sequence, with only one transistor being on in any time interval. The rate or frequency at which the transistors may be switched can be varied by frequency adjusting means 87 from 60 Hz to 5 KHz, although higher or lower frequencies may be used if desired.

In a typical operation, the cell is subdivided into twenty-four sub-cells and to ize each pair of anodes, potential is supplied through the conduit 74 connected to the contact bar 72 by means of which they are connected. If desired, however, only some of the anode pairs may be energized, e.g. six, or some other multiple of twenty-four, energization being effected either simultaneously or, preferably, sequentially, as described. Furthermore, energization of the anodes may be effected by a reverse pulsing procedure in which positive pulses of current are alternated with short duration negative pulses. While it is thus apparent that various modes of energization may be employed, the sequential system is preferred for optimal results.

By reason of the feature of construction of the electrolyte cell of the invention described above, it is possible to utilize high current densities and to achieve rapid electroplating with high efficiency, with the result that a greater quantity of material, i.e. a greater length of strip, can be uniformly electroplated in unit time in an apparatus occupying the space of a larger conventional cell or, expressed another way, equivalent amounts of material can be electroplated in a cell occupying less space. The end result in either case is greater speed of electroplating per unit length of strip being processed.

While an illustrative embodiment of the invention has been described and illustrated, it will be apparent to persons skilled in the art that various changes and modifications may be made without departing from the invention as defined in the appended claims; and it is intended, therefore, that all matter described above and shown in the appended drawings shall be interpreted as illustrative only, and not as limitative of the invention.

We claim:

1. High speed electroplating apparatus for electroplating a continuous strip of metal passed therethrough, comprising in combination:

an elongated cell having a bottom and side walls; a plurality of mutually-spaced partitions extending transversely within said cell between said side walls and engaging therewith and with the bottom of said cell, thereby dividing the length of said cell into a plurality of discrete sub-cells; each said sub-cell having a pair of spaced anodes; slots being provided in the partitions defining the front and rear of each sub-cell to enable said metal strip to progress longitudinally through said elongated cell while passing through each sub-cell; said spaced anodes being positioned to alternate sides of the path of passages of said strip through said sub-cell to establish an electric field therebetween; means for circulating electrolyte continuously through each sub-cell; and means for providing an electrical potential between said anodes and said moving metal strip to enable said electroplating action, the anode pair in each sub-cell being electrically insulated from other anode pairs in other sub-cells; and said means for applying potential to said anodes includes means for sequencing the application of the potential among sub-cells in accordance with a predesired pattern of activation.

2. Apparatus in accordance with claim 1, wherein said sequencing means applies potential to said sub-cells successively along the length of the cell, from sub-cell to adjacent sub-cell.

3. Apparatus in accordance with claim 1 wherein each sub-cell includes an opening at the bottom of same for admitting electrolyte; and wherein the said partitions defining each sub-cell are higher than the side walls of same, to enable electrolyte to discharge from said sub-cells by flow discharge over said side walls.

4. Apparatus in accordance with claim 3, further including a surrounding sump tank within which said cell is contained, for receiving said electrolyte from said cell, said sump tank including drain means for discharging electrolyte.

5. Apparatus in accordance with claim 1, wherein said means for sequencing is effective for sequencing the application of the potential seriatim among all of said subcells in the direction of passage of said strip through said apparatus, whereby only one anode pair is activated at a time.

6. Apparatus in accordance with claim 1, wherein said means for sequencing is effective for sequencing the application of the potential seriatim among selected ones of said sub-cells in the direction of passage of said strip through said apparatus, whereby only one anode pair is activated at a time.

7. An apparatus as defined in claim 1, wherein said means for sequencing is effective to vary the switching frequency from 60 Hz to 5 KHz.

8. Electroplating apparatus for electroplating a strip of metal being passed through it, comprising in combination, an elongated cell having a bottom and side walls, a plurality of transversely extending partitions higher than said side walls and subdividing said cell into a plurality of sub-cells, each of said partitions being formed with a slot and the slots of said paritions being aligned for reception and passage of said strip, anodes in each of said sub-cells, means for introducing electrolyte upwardly through said bottom into each of said sub-cells, to fill said sub-cells and overflow said side walls; means exteriorly of said cell for collecting electrolyte that overflows said side walls; and means for removing electrolyte from said collecting means, the anodes in each sub-cell being electrically insulated from other anodes in other sub-cells; and said means for applying potential to said anodes includes means for sequencing the application of the potential among sub-cells in accordance with a pre-desired pattern of activation.

9. Electroplating apparatus as defined in claim 8, wherein each sub-cell contains two anodes joined by a bus bar, and means electrically connecting each bus bar.

10. Electroplating apparatus as defined in claim 8, wherein said bottom is provided with an aperture communicating with each of said sub-cells to provide said means for introducing electrolyte, and said apparatus further comprises an enclosed receptacle underlying said bottom and means for admitting electrolyte under pressure into said receptacle to fill said receptacle and cause electrolyte to flow through said opertures to fill said sub-cells with electrolyte.

11. Electroplating apparatus as defined in claim 8, wherein said means for collecting electrolyte comprises a tank enclosing said sides and said bottom of said cell.

12. Apparatus in accordance with claim 8, wherein said means for sequencing is effective for sequencing the application of the potential seriatim among all of said subcells in the direction of passage of said strip through said apparatus, whereby only the anodes in one sub-cell are activated at a time.

13. Apparatus in accordance with claim 8, wherein said means for sequencing if effective is effective for sequencing the application of the potential seriatim among selected ones of said sub-cells in the direction of passage of said strip through said apparatus, whereby only the anodes in one sub-cell are activated at a time.

14. An apparatus as defined in claim 8, wherein said means for sequencing is effective to vary the switching frequency from 60 Hz to 5 KHz.

* * * * *